United States Patent [19]

Ito et al.

[11] 4,112,378
[45] Sep. 5, 1978

[54] TELEVISION TUNER CIRCUIT FOR SELECTION OF VHF AND UHF/VHF CONVERTED TELEVISION SIGNALS

[75] Inventors: Katsuo Ito; Bunjiro Murata, both of Kanazawa; Yoji Maeda, Ishikawa; Eiichi Hibino, Kanazawa, all of Japan

[73] Assignee: Murata Manufacturing Co., Ltd., Japan

[21] Appl. No.: 780,112

[22] Filed: Mar. 22, 1977

[30] Foreign Application Priority Data

Dec. 25, 1976 [JP] Japan .............................. 51-156695

[51] Int. Cl.² .............................................. H04B 1/06
[52] U.S. Cl. ................................... 325/464; 325/459; 325/461; 334/52
[58] Field of Search ............... 325/452, 457, 458, 459, 325/461, 464, 465, 468; 358/191; 334/1, 2, 49, 50, 52, 56, 71, 74, 77

[56] References Cited

U.S. PATENT DOCUMENTS

| | | | |
|---|---|---|---|
| 3,571,723 | 3/1971 | Ogusu | 325/461 |
| 3,594,647 | 7/1971 | Ishigaki | 325/461 |
| 3,629,708 | 12/1971 | Thurnell | 325/461 |
| 3,876,965 | 4/1975 | Kitamura et al. | 325/452 |
| 3,961,265 | 6/1976 | Ohigashi et al. | 325/452 |

Primary Examiner—Robert L. Griffin
Assistant Examiner—Jin F. Ng
Attorney, Agent, or Firm—Staas & Halsey

[57] ABSTRACT

A VHF television tuner circuit for selection of a television signal through mechanical selection of inductance coils comprises a first terminal for receiving a VHF television signal comprising a high and low VHF channel signals; a second terminal for receiving a UHF/VHF converted television signal; a mechanical channel selection switch arrangement for selection of a plurality of channel positions by rotation of a channel selection shaft said mechanical channel selection switch arrangement comprising a radio frequency coil switching stage and an oscillation coil switching stage; a radio frequency coil means coupled to the radio frequency coil switching stage; an oscillation coil coupled to the oscillation coil switching stage; a radio frequency amplifier coupled to the radio frequency coil switching stage for selectively amplifying a desired radio frequency signal; a local oscillator coupled to the oscillation coil switching stage for providing a local oscillation frequency, the frequency of which is different by a given frequency difference from the selectively amplified radio frequency signal; and a mixer responsive to the radio frequency amplifier and the local oscillator for providing an intermediate frequency signal. The radio frequency coil switching stage comprises a first stage radio frequency coil switch for selectively grounding or disconnecting the transmission path from said first terminal and for selecting a radio frequency coil corresponding to each VHF channel, and a second stage radio frequency coil switch selectably connectable to the radio frequency coil selected by the first stage radio frequency coil switch for selectively connecting said second terminal to said radio frequency amplifier, and for selectively connecting various capacitors in various ways to form a resonance circuit for selecting a desired radio frequency.

14 Claims, 17 Drawing Figures

TELEVISION TUNER CIRCUIT FOR SELECTION OF VHF AND UHF/VHF CONVERTED TELEVISION SIGNALS

BACKGROUND OF THE INVENTION

1. Field of the Invention

The present invention relates to a very high frequency television tuner circuit. More specifically, the present invention relates to an improvement in a circuit configuration at the radio frequency amplifying stage in a VHF television tuner for selection of VHF television channel signals and a UHF/VHF converted television channel signal through mechanical switching selection of inductance coils.

2. Description of the Prior Art

Typically, a very high frequency (or VHF) television tuner includes a mechanical switching selection scheme of inductance coil means for selection of a broadcasting television signal, a radio frequency amplifier operatively coupled to said inductance coil means for selectively amplifying a desired radio frequency signal, a local oscillator operatively coupled to said inductance coil means for providing a local oscillation frequency signal, the frequency of which is different by a given frequency difference from said selectively amplified radio frequency signal, a mixer responsive to the selectively amplified radio frequency signal from the radio frequency amplifier and the local oscillation signal from the local oscillator for providing an intermediate frequency signal, and an intermediate frequency tuned circuit for selectively withdrawing the said intermediate frequency signal.

The above described mechanical switching selection scheme of inductance coil means may comprise a so-called turret type structure, i.e., a plurality of sets of coils, each set allotted for one channel, provided on a turret rotatably mounted so as to be rotated by means of a channel selection shaft, and a switching contact arrangement for selection of a desired set of coils as a function of manual rotation of the channel selection shaft. Alternatively, the above described mechanical switching selection scheme of inductance coil means may comprise a so-called switch type structure, i.e., a plurality of sets of coils, each set allotted for one channel, provided in a stationary manner along the periphery around a given axis, and a switching contact arrangement rotatably mounted about the axis so as to be rotated by means of a channel selection shaft.

FIG. 1 is a block diagram of a typical VHF television tuner VT. The tuner VT is shown connected to an antenna VA for receiving a broadcasting VHF television wave and comprises a radio frequency amplifier RFA preceded and succeeded by a preceding stage radio frequency tuned circuit RFT1 and a succeeding stage radio frequency tuned circuit RFT2, respectively, for selectively amplifying the desired radio frequency signal, a local oscillator OSC for providing an oscillation frequency signal, the frequency of which is different by a given frequency difference from said selected or desired radio frequency signal, a mixer MIX responsive to said received radio frequency signal from the succeeding stage radio frequency tuned circuit RFT2 and to said local oscillation frequency signal from said local oscillator OSC for providing an intermediate frequency signal, and an intermediate frequency tuned circuit IFT for selectively withdrawing said intermediate frequency signal, and which is shown succeeded by an intermediate frequency amplifier IFA in a television receiver.

The tuner shown in FIG. 1 is also shown connected to a UHF/VHF converter UT which is connected to an antenna UA for receiving a broadcasting UHF television wave. Typically the UHF/VHF tuner is structured to convert a UHF television signal into a VHF television signal of a predetermined frequency and having the same television information. Accordingly, the VHF television tuner VT is adapted to receive selectively the above described VHF television signal of a predetermined frequency.

The high frequency tuned circuits RFT1 and RFT2 each comprise inductance coils L1 and L2, respectively, which are to be selected for each channel by means of a mechanical switching selection means (not shown in FIG. 1) described previously, and each are shunted by capacitors C1 and C2, respectively, to form radio frequency tuned circuits. The oscillator OSC also comprises an inductance coil L3, which is also selected for each channel by means of the mechanical switching selection means (not shown in FIG. 1) and is shunted by a capacitor C3 to form an oscillator tuned circuit OSCT. Although the inductance values of the coils L1, L2 and L3 are changeable by means of the mechanical switching selection means, and hence the frequencies of the tuned circuits RFT1, RFT2 and OSCT are accordingly changeable for the purpose of selection of a desired channel, the difference between the frequencies of the radio frequency tuned circuits RFT1 and RFT2 and the oscillator tuned circuit OSCT is kept constant, so that a constant intermediate frequency signal may be obtained from the mixer MIX. Therefore, the intermediate frequency tuned circuit IFT is tuned to the predetermined intermediate frequency.

In implementing a VHF television tuner as shown in FIG. 1 for selection of VHF television channel signals and a UHF/VHF converted television channel signal through mechanical switching selection of inductance coils, it is necessary to selectively connect a few capacitors to the selected radio frequency inductance coils simultaneously with switching selection of the radio frequency inductance coils, as is well known to those skilled in the art. In addition, the tuner should be capable of switching the input terminal to selectively receive a VHF television signal or a UHF/VHF converted television signal. Hence, a conventional VHF television tuner for selection of VHF television channel signals and a UHF/VHF television signal through mechanical switching selection of inductance coils comprises a complicated mechanical switching scheme.

FIG. 2 shows a schematic diagram of a conventional VHF television tuner circuit for selection of a VHF television signal and a UHF/VHF converted television signal through mechanical switching selection of inductance coils, in which only the preceding radio frequency tuned circuit RFT1 and a radio frequency amplifier RFA are schematically shown. A VHF signal input terminal VIP is connected through an antenna filter AF to the radio frequency tuned circuit RFT1. The antenna filter AF comprises a well known high pass filter of an LC type and is provided to prevent any interference signal of the intermediate frequency band from being transferred to the subsequent stages. The output from the antenna filter is connected to the junction of capacitors C11 and C12 which constitute a capacitance divider circuit and serve to contribute a portion of the capacitance for the radio frequency tuned circuit RFT1.

The mechanical switching scheme of the embodiment shown comprises four sets of switches to implement the radio frequency tuned circuit RFT1. More specifically, the mechanical switching scheme for the radio frequency tuned circuit RFT1 comprises four blades or movable contacts 21, 22, 23 and 24, each operatively associated with stationary contacts, as shown in the figure. The first and second blades 21 and 22 are formed on the front and rear surfaces of a rotor, not shown, fixedly provided on the channel selection shaft at the corresponding sections in the tuner. Similarly, the third and fourth blades 23 and 24 are also formed on the front and rear surfaces of another rotor, not shown, fixedly provided to the channel selection shaft at the respective sections in the tuner. These blades 23 and 24 are also electrically interconnected. The first blade 21 is adapted to short circuit a capacitor C1 if and when the first set of switches implemented by the blade 21 is turned to any one of low band channels and to open circuit the same for the remaining channels. To that, two stationary contacts connected across the capacitor C1 are adapted to be in contact with the largest diameter portion of the blade 21 corresponding to the low band channels so as to short circuit the capacitor C1 only for these low band channels. On the other hand, the second blade 22 is aimed to short circuit another capacitor C2 only for the high band channels and the UHF/VHF converted channel. According to the Japanese television standard system, the low band channels include channel Nos. 1, 2 and 3 and the high band channels include channel Nos. 4 through 12. This blade 22 is also aimed to selectively switch the inductance coils. To that end, coil elements, spirally wouned, are each connected between the adjacent two stationary contacts 1 through 12. For the purpose of individual selection of inductance coils for each channel, the blade has the largest diameter portion of one channel width so as to individually contact each stationary contact. In order to short circuit the capacitor C2 only for the high band channels, the blade 22 further has a medium diameter portion to cover the high band channels, while the remaining portion of the blade 22 is selected to be the smallest diameter portion. The stationary contacts 1 and u are connected across the capacitor C2 and the contact 1 is extended to reach the smallest diameter portion while the stationary contact u is extended to reach the medium diameter portion of the blade 22. The third blade 23 is allotted for the purpose of selectively short circuitting another capacitor C3 to be selectively inserted between the radio frequency tuned circuit RFT1 and the radio frequency amplifier RFA. To that end, the blade 23 has the high band channel portion formed of a larger diameter and the low band channel portion formed of a smaller diameter. The stationary contact is selected to reach the larger diameter. The fourth blade 24 is used to selectively connect a UHF/VHF converted signal input terminal to the radio frequency amplifier RFA. To that end, the UHF/VHF converted input signal terminal UIP is connected to a VHF tuned circuit VFT and the output therefrom is connected through a capacitor C5 to a stationary contact corresponding to the UHF/VHF converted channel position. The fourth blade 24 has the VHF/UHF converted channel portion formed of a larger diameter and the remaining portion formed of a smaller diameter so that, if and when the channel switching scheme is turned to the UHF/VHF converted channel, the UHF/VHF converted signal input terminal UIP is coupled to the radio frequency amplifier RFA.

FIG. 3A shows an equivalent circuit of the FIG. 2 diagram when the channel selection switch is turned to any one of high band channels, FIG. 3B shows an equivalent circuit displaying in a simplified manner the FIG. 3A equivalent circuit, FIG. 3C is an equivalent circuit of the FIG. 2 diagram when the channel selection switch is turned to any one of the low band channels, and FIG. 3D shows an equivalent circuit of the FIG. 2 diagram when the channel selection switch is turned to the UHF/VHF converted channel. It is pointed out that, referring to FIGS. 3A and 3B, since the capacitance value of the capacitor C4 is relatively large in terms of the high band channel frequency, the capacitance C4 may be considered as an inductance.

As seen from the foregoing description with reference to FIGS. 2 and 3, it is seen that a conventional VHF television tuner for selection of VHF television channels and a UHF/VHF converted channel through mechanical switching selection of inductance coils uses one blade for selective connection of each capacitor to be selectively connected to the selected inductance coil between the high and low band channels, and also uses one separate blade for selection of the UHF/VHF converted channel. However, this increases the number of sections and the number of blades in the channel selection switch arrangement. This accordingly increases the number of stationary contacts or clips. Thus, the structure of the channel selection switch arrangement for use in the above described VHF television tuner becomes complicated, which makes the cost expensive. In addition, more time is consumed for assemblage of such a VHF television tuner.

SUMMARY OF THE INVENTION

Briefly described, the present invention comprises a VHF television tuner circuit for selection of VHF television channels and a UHF/VHF converted television channel through mechanical selection of inductance coil means, comprising: first receiving means for receiving a VHF television signal, said VHF television signal comprising a high band channel VHF television signal and a low band channel VHF television signal; second receiving means for receiving a UHF/VHF converted channel television signal; mechanical switching channel selection means including a rotatably mounted channel selection shaft for selection of a plurality of channel positions by rotation of said channel selection shaft, said channel positions including at least said high band channel, said low band channel and said UHF/VHF converted channel, said mechanical switching channel selection means comprising a radio frequency inductance coil switching stage and an oscillation inductance coil switching stage; radio frequency inductance coil means operatively associated with said radio frequency inductance coil switching stage for being selected as to the inductance value thereof by rotation of said channel selection shaft; oscillation inductance coil means operatively associated with said oscillation inductance coil switching stage for being selected as to the inductance value thereof by rotation of said channel selection shaft; radio frequency amplifying means operatively coupled to said selected radio frequency inductance coil means for selectively amplifying a desired radio frequency signal; local oscillating means operatively coupled to said selected oscillation inductance coil means for providing a local oscillation frequency signal, the frequency of which is different by a given frequency difference from said selectively amplified radio frequency signal; mixing means responsive to said selectively amplified radio frequency signal from said radio frequency amplifying means and said local oscillation frequency signal from said local oscillating means for providing an intermediate frequency signal. Said radio frequency inductance coil switching stage comprises first stage radio frequency switching means and second stage radio frequency switching means, said first receiving means being connected to said first stage radio frequency switching means and said second receiving means being connected to said second stage radio frequency switching means; said first stage radio frequency switching means comprising means associated with said UHF/VHF converted channel position for disabling the transmission path from said first receiving means, and means associated with said high and low band channel positions for selecting the radio frequency inductance coil means corresponding to each VHF channel for connecting the same to said second stage radio frequency switching means. Said VHF television tuner circuit further comprises capacitor means coupled to said selected radio frequency inductance coil means for constituting resonance circuit means for selecting said desired radio frequency, said capacitor means comprising first capacitor means and second capacitor means; said second stage radio frequency switching means comprising means associated with said UHF/VHF converted channel position for selectively connecting said second receiving means to said radio frequency amplifying means, means associated with said high band channel positions for connecting said first and second capacitor means in said resonance circuit means in a parallel fashion, and means associated with said low band channel positions for connecting said first capacitor means in said resonance circuit and for connecting said second capacitor means between said resonance circuit means and said radio frequency amplifying means.

Preferably, said means for disabling the transmission path from said first receiving means comprises means associated with said UHF/VHF converted channel position for grounding said transmission path from said first receiving means. However, more preferably, said means for disabling transmission path from said first receiving means comprises means associated with said UHF/VHF converted channel position for selectively disconnecting said transmission path from said first receiving means.

Therefore, a principal object of the present invention is to provide an improved VHF television tuner circuit for selection of VHF television channels and a UHF/VHF converted television channel through mechanical switching selection of inductance coil means.

Another object of the present invention is to provide an improved VHF television tuner circuit for selection of VHF television channels and a UHF/VHF converted television channel through mechanical switching selection of inductance coil means, wherein the number of stages of the switching arrangement for the radio frequency tuned circuit is decreased while the electrical characteristic of the tuner circuit is maintained.

A further object of the present invention is to decrease the number of circuit components required for the radio frequency tuned circuit in a VHF television tuner for selection of VHF television channels and a UHF/VHF converted television channel through mechanical switching selection of inductance coil means.

Still a further object of the present invention is to simplify assemblage of a VHF television tuner for selection of VHF television channels and a UHF/VHF converted television channel through mechanical switching selection of inductance coil means, whereby the time for assemblage and thus the cost for assemblage is decreased.

These objects and other objects, features, aspects and advantages of the present invention will become more apparent from the following detailed description of the preferred embodiments of the present ivnention made in conjunction with the accompanying drawings.

DESCRIPTION OF THE PREFERRED EMBODIMENTS

Figure 4:
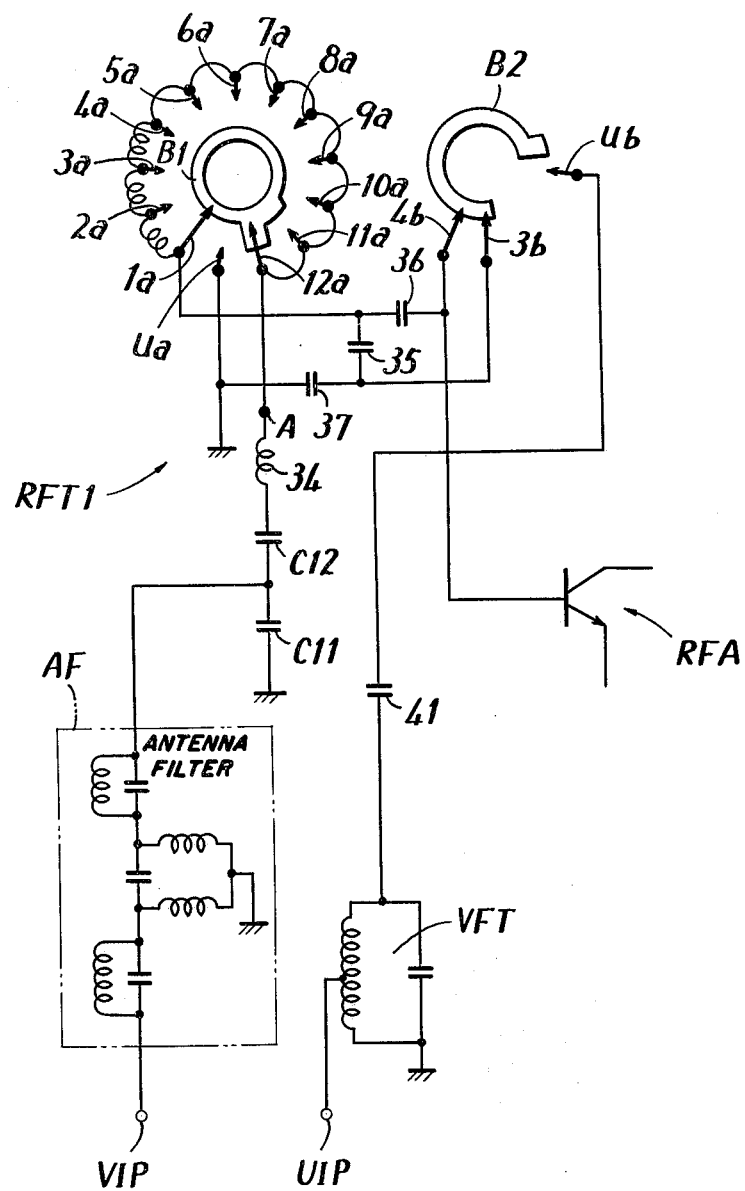
FIG. 4 is a schematic diagram of only the radio frequency tuned circuit RFT1 and the radio frequency amplifier RFA of an embodiment of the present invention.

FIG. 4 is a schematic diagram of only the radio frequency tuned circuit RFT1 and the radio frequency amplifier RFA of an embodiment of the present invention. The FIG. 4 embodiment comprises an improvement in the FIG. 2 embodiment. Therefore, like portions have been denoted by like reference characters. Hence, description will be made of the FIG. 4 embodiment centering on the improved portions.

The VHF signal input terminal VIP is connected to an antenna filter AF, which comprises a common LC type high pass filter and is aimed to prevent any interference signal in an intermediate frequency band from being entered. The output from the antenna filter AF is connected to the junction of the capacitors C11 and C12 which constitute a capacitance dividing circuit. The terminal of the capacitor C12 is connected through an auxiliary inductance coil 34 to the junction A.

As seen from FIG. 4, the embodiment comprises only two blades B1 and B2. The first blade B1 is formed on the rear surface of a rotor, not shown, fixedly provided to the channel selection shaft at the corresponding section, while the second blade B2 is formed on the front surface of the rotor. As seen from the figure, the blade B1 has one channel portion formed of the largest diameter, the adjacent one channel portion formed of a medium diameter and the remaining portion formed of the smallest diameter. The first set of switch arrangement including the blade B1 comprises thirteen clips 1a, 2a, 3a, ... 12a and Ua by way of stationary contacts such that the said largest diameter portion of the blade B1 may individually contact any one of the clips when the channel selection shaft is turned to the corresponding position. However, the clip for the position 12a is extended to reach the medium diameter portion of the blade B1 and the clip for the position 1a is extended to reach the smallest diameter portion of the blade B1.

The second blade B2 has one channel portion formed of a larger diameter, the low band channel portion removed and the remaining portion formed of a smaller diameter. The switch arrangement including the blade B2 comprises three clips 3b, 4b and Ub. The clip 3b is positioned to channel No. 3, which is of the highest frequency among the low band channels, and is elongated to reach the smaller diameter portion of the blade B2. The clip 4b is positioned at channel No. 4 which is of the lowest frequency among the high band channels, and is elongated to reach the smaller diameter portion of the blade B2. The clip Ub is positioned at the UHF/VHF converted channel position and is elongated to reach only the larger diameter portion of the blade B2.

A first capacitor 35 is connected between the clip 1a of the switch arrangement including the blade B1 and the clip 3b of the switch arrangement including the blade B2. A second capacitor 36 is connected between the clip 1a of the switch arrangement including the blade B1 and the clip 4b of the switch arrangement including the blade B2. The clip 12a is connected to the said auxiliary inductance coil 34. The clip Ua is grounded. A capacitor 37 is connected between the clip Ua of the switch arrangement including the blade B1 and the clip 3b of the switch arrangement including the blade B2. The clip 4b of the switch arrangement including the blade B2 is connected to the base electrode of a transistor implementing the radio frequency amplifier RFA. The clip Ub of the switch arrangement including the blade B2 is connected through a capacitor 41 and the tuned circuit VFT to the UHF/VHF converted channel signal terminal UIP.

Figure 5A:
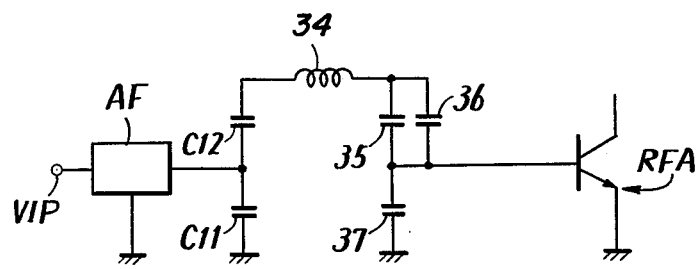
FIG. 5A shows an equivalent circuit of the FIG. 4 embodiment when the channel selection switch of the tuner is turned to any one of the high band channels.
Figure 5B:
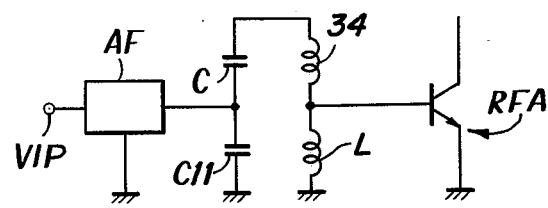
FIG. 5B shows an equivalent circuit, in a simplified manner, of the FIG. 5A equivalent circuit.
Figure 5C:
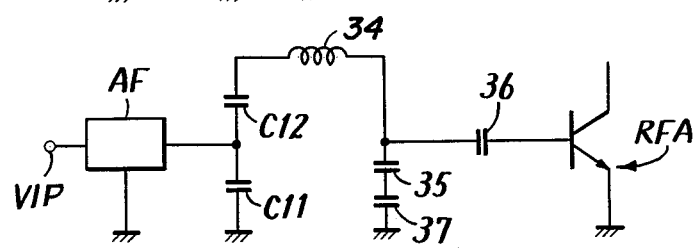
FIG. 5C shows an equivalnt circuit of the FIG. 4 embodiment when the channel selection switch is turned to any one of the low band channels.
Figure 5D:
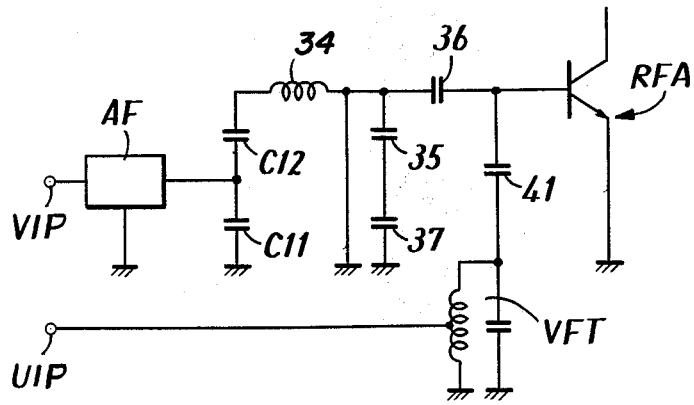
FIG. 5D shows an equivalent circuit of the FIG. 4 embodiment when the channel selection switch is turned to the UHF/VHF converted channel.

FIG. 5A shows an equivalent circuit of the FIG. 4 embodiment when the channel selection switch of the tuner is turned to any one of the high band channels; FIG. 5B shows an equivalent circuit, in a simplified manner, of the FIG. 5A equivalent circuit; FIG. 5C shows an equivalent circuit of the FIG. 4 embodiment when the channel selection switch is turned to any one of the low band channels; and FIG. 5D shows an equivalent circuit of the FIG. 4 embodiment when the channel selection switch is turned to the UHF/VHF converted channel. With simultaneous reference to FIGS. 5A through 5D, the operation of the FIG. 4 embodiment will be described.

In operation, assuming that the channel selection shaft, not shown, is turned to any one of the high band channels, the point A is connected directly or through a prescribed coil element to the clip 1a, while the clips 3b and 4b are short circuited. As a result the equivalent circuit shown in FIG. 5A is attained. Referring to FIG. 5A, the capacitance of the capacitor 37 is relatively large. Therefore, the capacitor 37 can be thought of as an inductive element L, in terms of the frequency of the high band channels. Thus, the FIG. 5A equivalent circuit may be changed to a simplified equivalent circuit as shown in FIG. 5B. Referring to FIG. 5B, the capacitor C represents a composite resultant capacitance of the capacitors C12, 35 and 36. Thus, it is appreciated that a parallel connection of the first and second capacitors 35 and 36 is included in the resonance circuit.

When the channel selection switch is turned to any one of the low band channels, the point A is connected through a prescribed coil element to the clip 1a, while the clips 3b and 4b are opened. As a result, the equivalent circuit as shown in FIG. 5C is attained. With particular reference to FIG. 5C, the first capacitor 35 is included in the resonance circuit, while the second capacitor 36 is connected between the junction of the first capacitor 35 and the inductance coil 34, and the base electrode of the transistor implementing the radio frequency amplifier RFA.

Now assume a case where the channel selection shaft is tuned to the UHF/VHF converted channel. The point A is then connected to the clip Ua, whereby the point A is grounded. The point A is also connected to the clip 1a, while the clips 3b and 4b are opened and the clips Ub and 4b are short circuited. As a result, the equivalent circuit as shown in FIG. 5D is attained. Thus, it is appreciated that the signal from the VHF signal input terminal VIP is grounded while the signal from the UHF/VHF converted signal input terminal UIP is transferred to the transistor implementing the radio frequency amplifier RFA.

Figure 2:
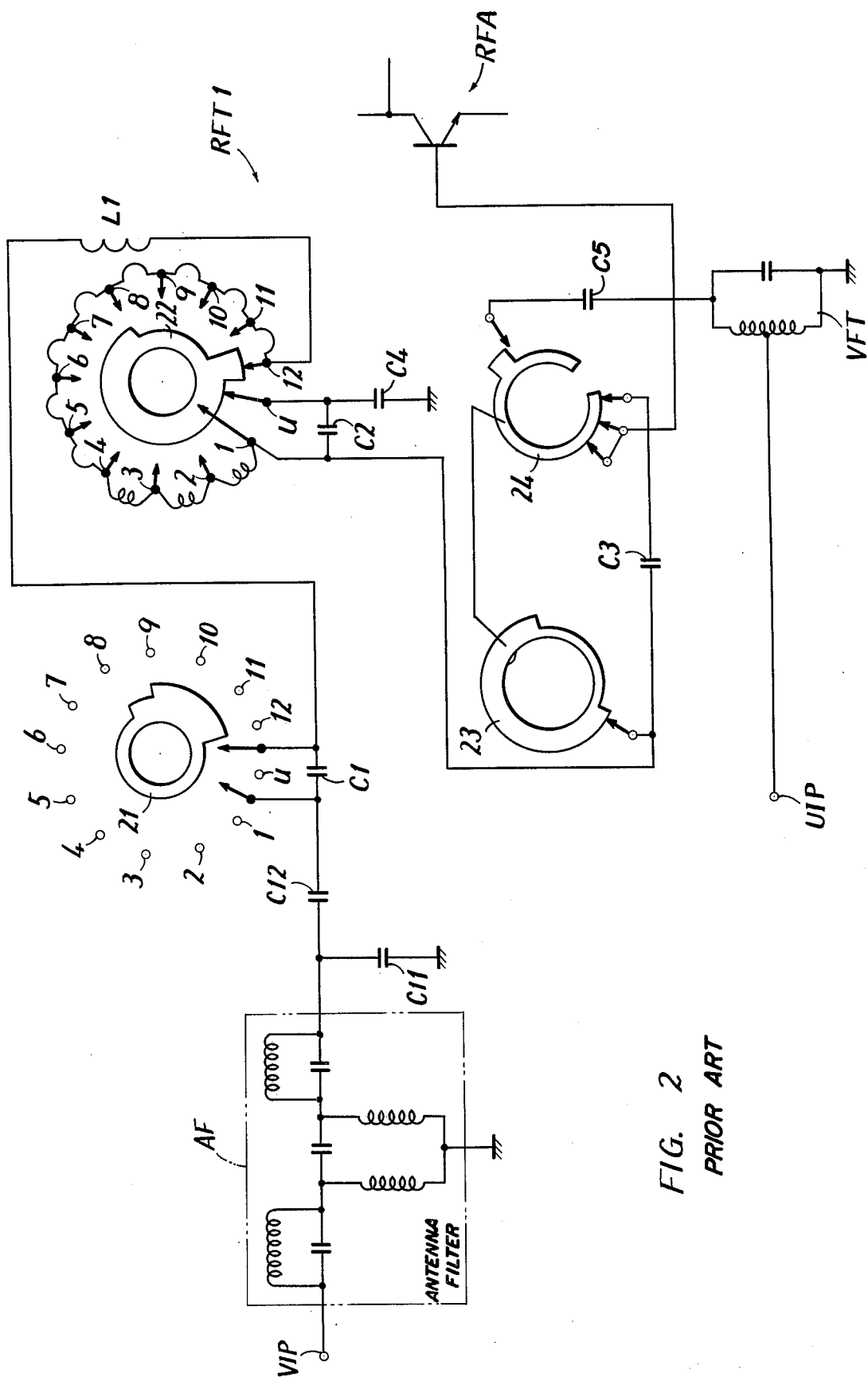
FIG. 2 shows a schematic diagram of a conventional VHF television tuner circuit for selection of a VHF television signal and a UHF/VHF converted television signal through mechanical switching selection of inductance coils, in which only the preceding radio frequency tuned circuit RFT1 and a radio frequency amplifier RFA is schematically shown.
Figure 3A:
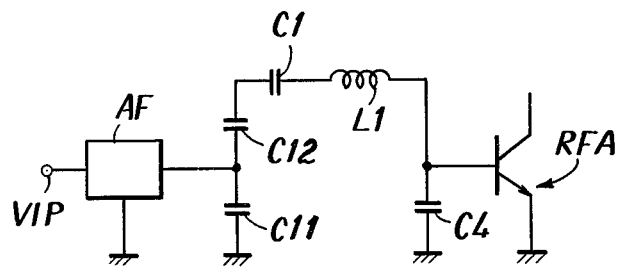
FIG. 3A shows an equivalent circuit of the FIG. 2 diagram when the channel selection switch is turned to any one of high band channels.
Figure 3B:
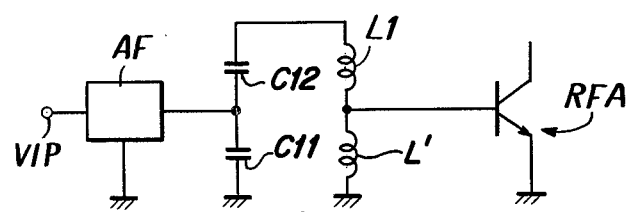
FIG. 3B shows an equivalent circuit displaying in a simplified manner the FIG. 3A equivalent circuit.
Figure 3C:
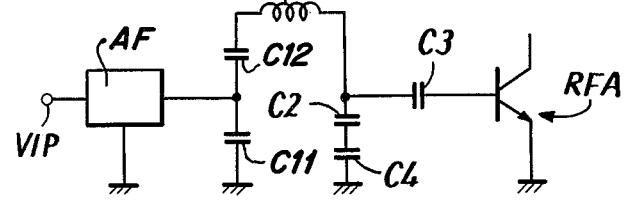
FIG. 3C is an equivalent circuit of the FIG. 2 diagram when the channel selection switch is turned to any one of the low band channels.
Figure 3D:
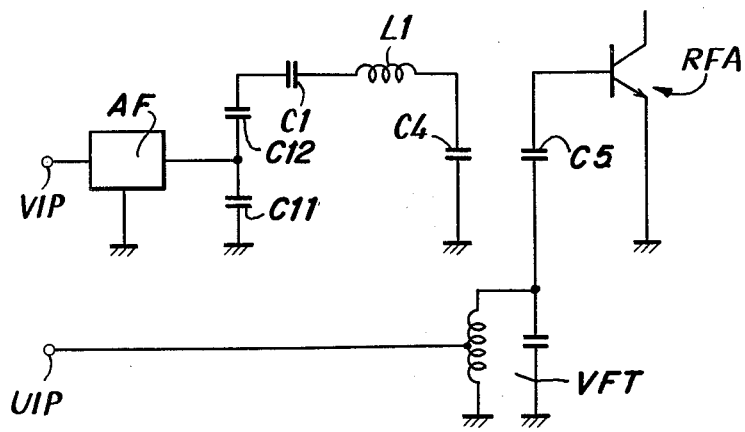
FIG. 3D shows an equivalent circuit of the FIG. 2 diagram when the channel selection switch is turned to the UHF/VHF converted channel.

According to the embodiment of the present invention, as shown, the structure of the mechanical switching arrangement for a VHF television tuner for selection of VHF television channels and a UHF/VHF converted television channel can be much simplified and the number of required circuit components can be decreased, as compared with the "prior art" tuner circuit of FIG. 2, while the electrical characteristic of the VHF television tuner circuit is maintained. The reason for this is that the "prior art" tuner circuit of FIG. 2 is adapted to selectively short circuit three capacitors and to selectively disconnect the transmission path from the VHF television signal input terminal in switching the channel selection switching arrangement among the high and low band channels and the UHF/VHF converted channel, by the use of four sets of the switch arrangement including four blades, whereas the embodiment of the present invention, as shown, is adapted to changeably connect two capacitors to the radio frequency tuned circuit and to selectively disable the transmission path from the VHF television signal input terminal, by the use of two sets of the switch arrangement including two blades.

In a specific comparison of the FIG. 4 embodiment with the "prior art" tuner of FIG. 2, it is pointed out that the number of the sections was reduced from two to one, the number of blades was reduced from four to two, the number of capacitors was reduced from eight to seven, and the number of clips was reduced from 20 to 16.

Although the embodiment described in conjunction with FIG. 4 is advantageous in that the number of circuit components is decreased and the structure of the channel selection switch is simplified, and hence the time for assemblage of the tuner can be shortened, a problem is encountered in that the UHF/VHF separation characteristic during reception of the UHF/VHF converted television channel is not as good. More specifically, although the transmission path connected from the VHF television signal input terminal VIP is grounded when a UHF/VHF converted channel is received because of mutual connection of the clips 12a and Ua, the VHF television signal is transferred through the blade B1 or through a stray capacitance between the blade B1 and the respective coil elements, and further through the capacitor 36 to the radio frequency amplifier RFA. As a result, the input signal received at the VHF television signal input terminal VIP is not completely bypassed to the ground, thereby degrading the UHF/VHF separation characteristic. In addition, with particular reference to FIG. 5D, a closed circuit is formed which includes capacitors C11, C12, 35 and 37 and the inductance coil 34, which closed circuit serves as an antenna so as to transmit a signal from the VHF input terminal VIP to the radio frequency amplifier RFA. Again, this undesired transmission of the signal degrades the UHF/VHF separation characteristic. It has been observed that, according to the FIG. 4 embodiment, an attenuation of only about 15dB can be obtained as to an undesired signal level from the VHF input terminal VIP with respect to a desired signal level to be transferred from the input terminal UIP to the radio frequency amplifier RFA. As a result of experimentation it has been confirmed that an attenuation of more than 40dB is preferred or required. Hence, there is room for improvement in the FIG. 4 embodiment.

Figure 6:
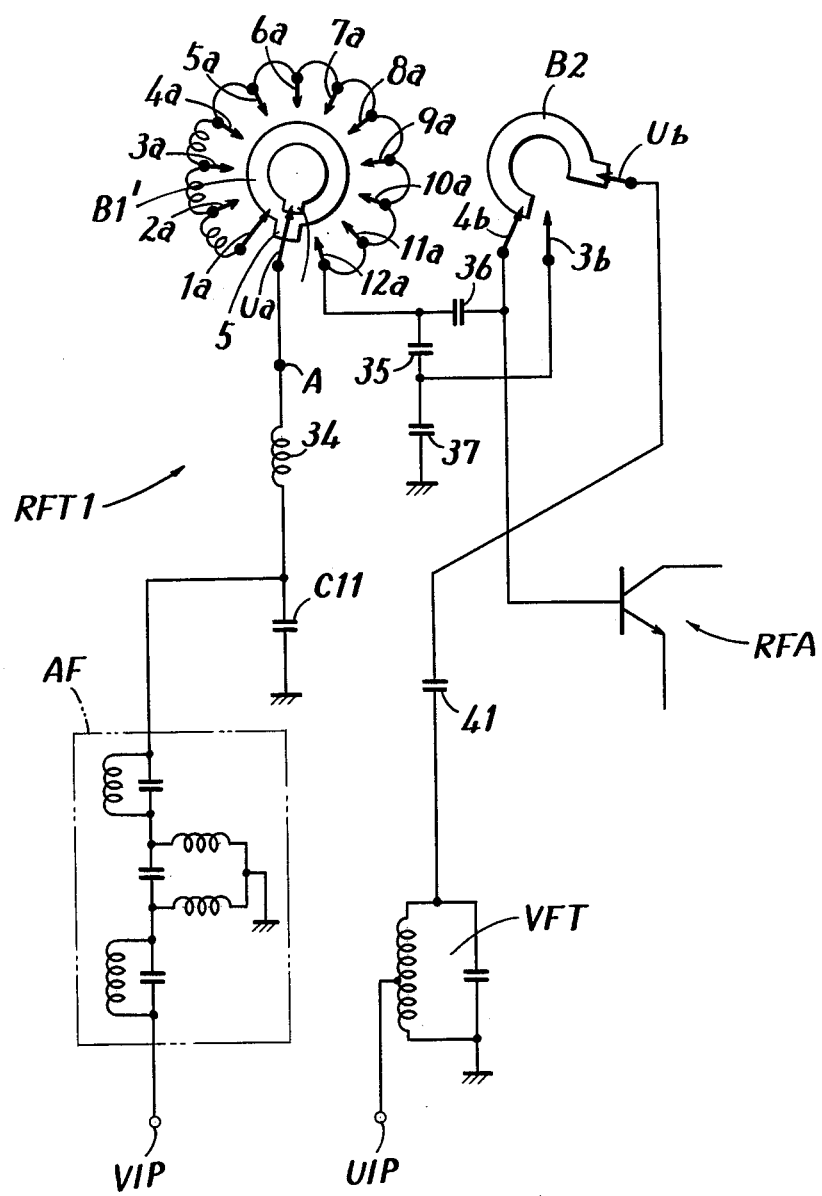
FIG. 6 is similar to FIG. 4 but shows a schematic diagram of only the radio frequency tuned circuit RFT1 and the radio frequency amplifier RFA of a preferred embodiment of the present invention.

According to another aspect of the present invention as shown in FIG. 6, a preferred embodiment of the invention is provided wherein the transmission path of the signal from the VHF television signal input terminal VIP is disconnected at a point as near as possible to the input terminal on the occasion of receipt of the UHF/VHF converted channel signal by causing the clip associated with the said transmission path to be opened.

FIG. 6 is similar to FIG. 4 but shows a schematic diagram of the radio frequency tuned circuit RFT1 and the radio frequency amplifier RFA of the above described preferred embodiment of the present invention. With simultaneous reference to FIGS. 4 and 6, description will be made of the FIG. 6 embodiment, centering on only those portions modified in the FIG. 6 embodiment. The point A is connected to the stationary contact Ua, the clip of which is elongated to reach the smallest diameter of the blade B1'. The blade B1' has the UHF/VHF channel portion formed of the largest diameter 5 and the remaining portion formed of the smallest diameter. The clip of the stationary contact 12a is elongated as long as the clips of the other stationary contacts 2a through 11a; however, the clip of the stationary contact 1a is elongated to reach the smallest diameter of the blade B1'.

The blade B1' further contains a notched portion on the inside edge thereof at the position corresponding to the largest diameter portion 5 such that, when the blade B1' is turned to the UHF/VHF converted channel, the clip associated with the stationary contact Ua does not contact the blade B1' because of the notched portion 6, although the clip for the stationary contact 1a always contacts the blade B1' irrespective of the notched portion 6. Thus, as the channel selection switch is rotated, corresponding ones of the clips 2a through 12a contact the largest diameter portion 5 of the blade B1' and the clip 1a always contacts the blade B1', whereas the clip Ua does not contact the blade B1' at the notched portion 6 even though the clip Ua contacts the blade B1' at the other positions. The capacitor C12 in FIG. 4 was included in the transmission path from the VHF input terminal VIP but is omitted in the FIG. 6 embodiment. The junction between the capacitors 35 and 36 is connected to the stationary contact 12a rather than to the stationary contact 1a. The circuit configuration of the other portions in the FIG. 6 embodiment is exactly the same as that in the FIG. 4 embodiment. Hence, the same portions have been designated by the same reference characters. Thus, it is believed not necessary to describe in more detail the circuit configuration of the FIG. 6 embodiment.

Figure 7A:
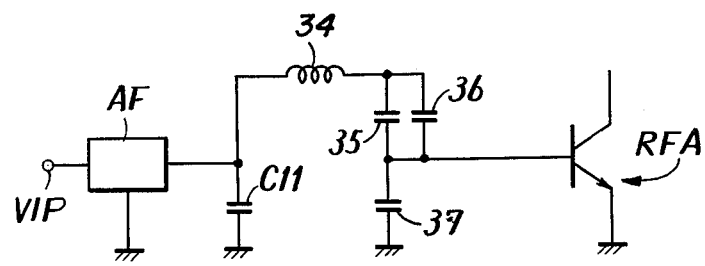
FIG. 7A shows an equivalent circuit of the FIG. 6 embodiment when the channel selecion switch of the tuner is turned to any one of the high band channels.
Figure 7B:
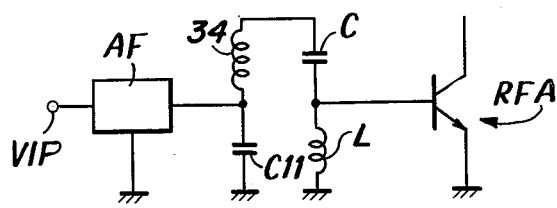
FIG. 7B shows an equivalent circuit in a simplified manner of the FIG. 7A equivalent circuit.
Figure 7C:
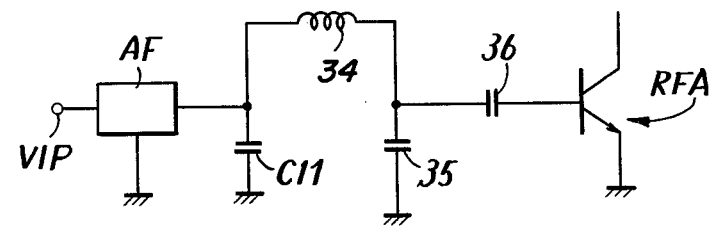
FIG. 7C shows an equivalent circuit of the FIG. 6 embodiment when the channel selection switch is turned to any one of the low band channels.
Figure 7D:
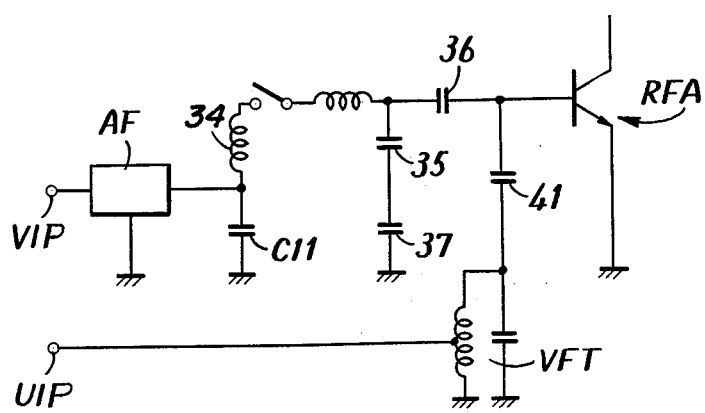
FIG. 7D shows an equivalent circuit of the FIG. 6 embodiment when the channel selection switch is turned to the UHF/VHF converted channel.

FIG. 7A shows an equivalent circuit of the FIG. 6 embodiment when the channel selection switch of the tuner is turned to any one of the high band channels; FIG. 7B shows an equivalent circuit, in a simplified manner, of the FIG. 7A equivalent circuit; FIG. 7C shows an equivalent circuit of the FIG. 6 embodiment when the channel selection switch is turned to any one of the low band channels; and FIG. 7D shows an equivalent circuit of the FIG. 6 embodiment when the channel selection switch is turned to the UHF/VHF converted channel. With simultaneous reference to FIGS. 7A through 7D, the operation of the FIG. 6 embodiment will be described.

In operation, assuming that the channel selection shaft, not shown, is turned to any one of the high band channels, the point A is connected directly or through a prescribed coil element to the clip 12a, while the clips 3b and 4b are short circuited. As a result, the equivalent circuit shown in FIG. 7A is attained. Referring to FIG. 7A, the capacitance of the capacitor 37 is relatively large. Therefore, the capacitor 37 can be deemed as an inductance element in terms of the frequency of the high band channels. Thus, the FIG. 7A equivalent circuit may be changed to a simplified equivalent circuit as shown in FIG. 7B. Referring to FIG. 7B, the capacitance C represents the composite resultant capacitance of the capacitors 35 and 36. Thus, it is appreciated that a parallel connection of the first and second capacitors 35 and 36 is included in the resonance circuit.

When the channel selection switch is turned to any one of the low band channels, the point A is connected through a prescribed coil element to the clip 12a, while the clips 3b and 4b are opened. As a result, the equivalent circuit as shown in FIG. 7C is attained. With particular reference to FIG. 7C, the first capacitor 35 is included in the resonance circuit, while the second capacitor 36 is connected between the junction of the first capacitor 35 and the inductance coil 34, and the base electrode of the transistor implementing the radio frequency amplifier RFA.

Now assume a case where the channel selection shaft is turned to the UHF/VHF converted channel. The point A does not contact the blade B1, and thus, the line is opened, whereby the transmission path from the VHF television signal input terminal VIP is completely disconnected from the transistor implementing the radio frequency amplifier RFA. Since the signal from the VHF input terminal VIP is interrupted at a position near to the input terminal VIP, only the signal from the UHF/VHF converted input terminal UIP is transmitted to the base electrode of the transistor implementing the radio frequency amplifier RFA. Since the above described disconnection is caused, by this embodiment of the invention, to take place at a position nearer to the input terminal VIP, as compared with the coil elements provided around the section including the blade B1', the coil elements do not serve as an antenna for the signal from the VHF television signal input terminal VIP, and thus, the same is not transmitted to the base electrode of the transistor implementing the radio frequency amplifier RFA. As a result, the signal from the VHF input terminal VIP is completely interrupted in accordance with the embodiment shown.

Figure 1:
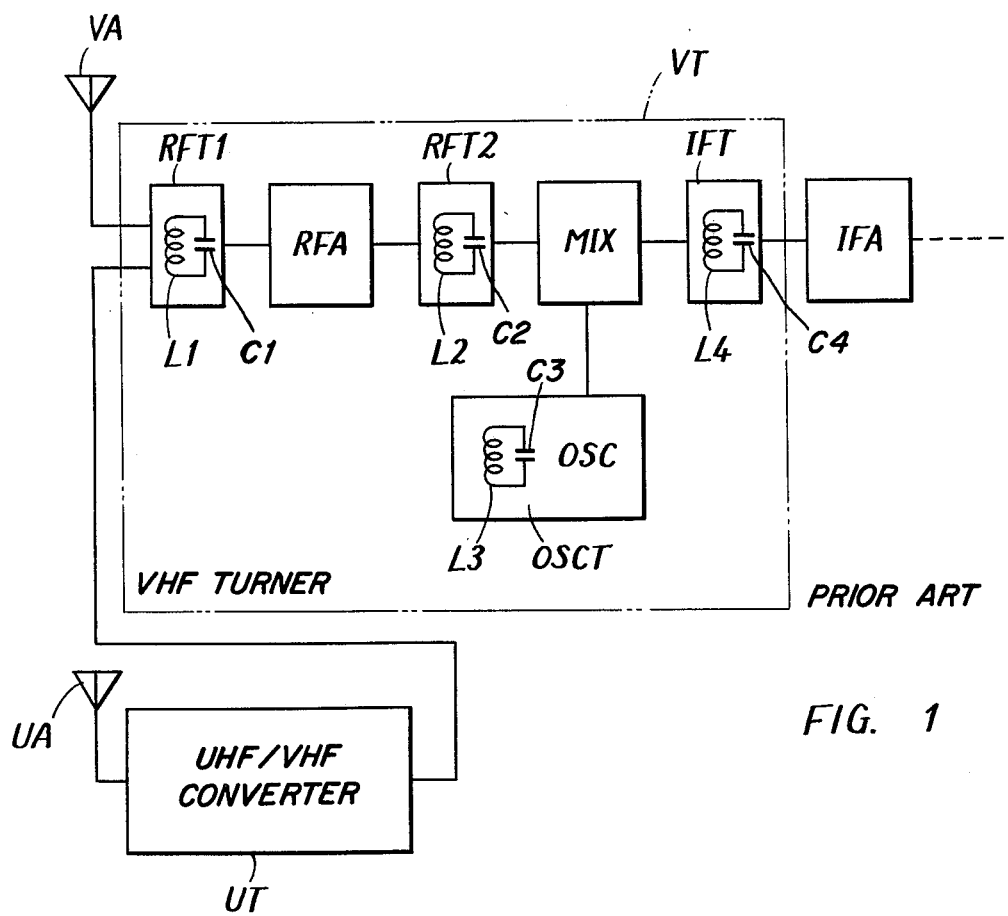
FIG. 1 is a block diagram of a typical VHF television tuner VT.
Figure 8:
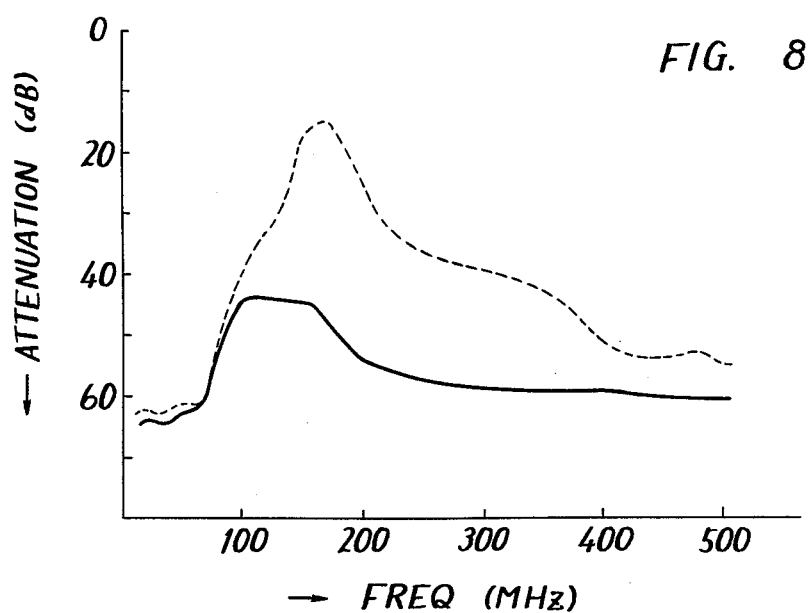
FIG. 8 is a graph showing a comparison of the UHF/VHF separation charcteristics of the FIG. 4 embodiment and the FIG. 6 embodiment.

FIG. 8 is a graph showing a comparison of the UHF/VHF separation characteristics of the FIG. 4 embodiment and the FIG. 6 embodiment. Referring to FIG. 8, the abscissa indicates the frequency of the signal, while the ordinate indicates the attenuation of an undesired signal transmitted from the VHF input terminal VIP with respect to a desired signal transmitted from the UHF/VHF converted input terminal to the transistor implementing the radio frequency amplifier RFA. In the graph, the solid line curve shows the UHF/VHF separation characteristic of the FIG. 6 embodiment and the dotted line curve shows the UHF/VHF separation characteristic of the FIG. 4 embodiment. It is seen from the graph that, according to the FIG. 6 embodiment, the attenuation of an undesired signal level with respect to the desired signal level assumes a value far exceeding 40dB. Such an improved UHF/VHF separation characteristic is achieved by full disconnection of the transmission path from the VHF input terminal VIP on the occasion of selection of the UHF/VHF converted channel by the inventive tuner.

Although this invention has been described and illustrated in detail, it is to be clearly understood that the same is set forth by way of illustration and example only, and is not to be taken by way of limitation, the spirit and scope of this invention being limited only by the terms of the appended claims.

What is claimed is:

1. A VHF television tuner circuit for selection of VHF television channels and a UHF/VHF converted television channel through mechanical selection of induction coils, comprising:

first receiving means for receiving a VHF television signal, said VHF television signal comprising a high band channel VHF television signal and a low band channel VHF television signal;

second receiving means for receiving a UHF/VHF converted channel television signal;

mechanical switching channel selection means including a rotatably mounted channel selection shaft for selecting one of a plurality of channel positions by rotation of said channel selection shaft, said channel positions including at least high band channel positions, low band channel positions and a UHF/VHF converted channel position, said mechanical switching channel selection means comprising a radio frequency inductance coil switching stage and an oscillation inductance coil switching stage;

radio frequency inductance coil means comprising a plurality of induction coils for establishing a radio frequency tuned circuit of inductance value corresponding to said selected channel position in response to said radio frequency inductance coil switching stage by rotation of said channel selection shaft so as to provide a desired radio frequency signal corresponding to said selected channel position;

oscillation inductance coil means for establishing an oscillation tuned circuit in response to said oscillation inductance coil switching stage by rotation of said channel selection shaft;

radio frequency amplifying means coupled to said radio frequency inductance coil means for selectively amplifying said desired radio frequency signal;

local oscillating means coupled to said oscillation inductance coil means for providing a local oscillation frequency signal of frequency corresponding to said oscillation tuned circuit and which is different, by a given frequency difference, from the frequency of said selectively amplified desired radio frequency signal;

mixing means responsive to said selectively amplified desired radio frequency signal from said radio frequency amplifying means and said local oscillation frequency signal from said local oscillating means for providing an intermediate frequency signal;

said first receiving means, said radio frequency inductance coil means, and said radio frequency amplifying means being connected in sequence to define a transmission path for said VHF television signal, and said second receiving means and said radio frequency amplifying means being connected in sequence to define a transmission path for said UHF/VHF converted television signal;

said radio frequency inductance coil switching range comprising only a first stage radio frequency switch and a second stage radio frequency switch, said first receiving means being connected to said first stage radio frequency switch and said second receiving means being connected to said second stage radio frequency switch;

said first stage radio frequency switch comprising disabling means responsive to selection of said UHF/VHF converted channel position for disabling the transmission path for said VHF television signal, and means associated with said high and low band channel positions for selecting said induction coils corresponding to said selected channel position for connecting the same to said second stage radio frequency switch;

capacitor means coupled to said radio frequency inductance coil means for establishing, with said selected induction coils, a resonance circuit corresponding to and selecting said desired radio frequency, said capacitor means comprising a first capacitor and a second capacitor;

said second stage radio frequency switch comprising selective connecting means responsive to selection of said UHF/VHF converted channel position for selectively connecting said second receiving means to said radio frequency amplifying means, additional connecting means responsive to selection of said high band channel positions for connecting said first and second capacitors in said resonance circuit in a parallel fashion, and further connecting means responsive to selection of said low band channel positions for connecting said first capacitor in said resonance circuit and for connecting said second capacitor between said resonance circuit and said radio frequency amplifying means.

2. A VHF television tuner circuit in accordance with claim 1, wherein said mechanical switching channel selection means comprises movable contacts fixedly positioned on said channel selection shaft, and stationary contacts corresponding to said channel positions and positioned in proximity to said movable contacts for coaction therewith.

3. A VHF television tuner circuit in accordance with claim 2, wherein said first stage radio frequency switch comprises a plurality of stationary contacts corresponding to said UHF/VHF converted channel position, said high band channel positions and said low band channel positions, and movable contacts positioned in proximity to said stationary contacts for coaction therewith.

4. A VHF television tuner circuit in accordance with claim 3, wherein said radio frequency inductance coil means comprises radio frequency inductance coil elements, each coupled between adjacent two stationary contacts of said first stage radio frequency switch corresponding to said high and low band channel positions, and said movable contacts are positioned in proximity to corresponding said stationary contacts for coaction therewith so as to select said radio frequency induction coils, whereby to provide said desired radio frequency signal corresponding to said selected channel position.

5. A VHF television tuner circuit in accordance with claim 2, wherein said second stage radio frequency switch comprises a first stationary contact coupled to said second receiving means, a second stationary contact coupled to said radio frequency amplifying means and to said second capacitor, and a third stationary contact coupled to said first capacitor, and said movable contacts of said second stage radio frequency switch are positioned in proximity to said first and second stationary contacts for coaction therewith in response to selection of said UHF/VHF converted channel position, and are positioned in proximity to said second and third stationary contacts in response to selection of said high band channel positions to coact therewith for connecting said first and second capacitors in parallel fashion, and in response to selection of said low band channel positions to coact therewith for connecting said first capacitor in said resonance circuit and for connecting said second capacitor between said resonance circuit and said radio frequency amplifying means by opening said second and third stationary contacts at said low band channel positions of said channel selection shaft.

6. A VHF television tuner circuit in accordance with claim 1, wherein said disabling means comprises means for grounding said transmission path for said VHF television signal.

7. A VHF television tuner circuit in accordance with claim 1, wherein said disabling means comprises means for establishing an open circuit in said transmission path for said VHF television signal.

8. In a VHF television tuner circuit for selecting a channel from a plurality of VHF television channels including high band, low band, and a UHF/VHF converted television channel, by mechanical selection to form a resonant circuit having electrical characteristics corresponding to said selected channel, and thus to tune to a desired radio frequency signal, said tuner circuit comprising:

first means for receiving television signals comprising VHF television signals, and producing said VHF television signals as an output thereof;

second means for receiving television signals comprising UHF/VHF converted television signals, and producing said UHF/VHF converted television signals as an output thereof;

channel selection means operator actuable for selecting one of a plurality of channel positions including high band, low band, and UHF/VHF converted channel positions corresponding to said selected channel;

a plurality of induction coils;

a pair of capacitors; and radio frequency amplifying means for selectively amplifying said desired radio frequency signal;

the improvement wherein said channel selection means includes only a first switch and a second switch;

said first switch including:
inhibiting means responsive to selection of said UHF/VHF converted channel position for inhibiting the output of said first receiving means, and means responsive to selection of one of said high band and low band channel positions for connecting corresponding at least one of said plurality of induction coils to said second switch, whereby to partially form said resonant circuit;

said second switch including:
means responsive to selection of said UHF/VHF converted channel position for connecting said second receiving means to said radio frequency amplifying means, means responsive to selection of one of said high band channel positions for connecting said pair of capacitors in parallel to corresponding at least one of said plurality of induction coils, whereby to completely form said resonant circuit having electrical characteristics corresponding to said selected one of said high band channels, and means responsive to selection of one of said low band channel positions for connecting a first one of said pair of capacitors to corresponding at least one of said plurality of induction coils to form a junction therebetween, and for connecting a second one of said pair of capacitors between said junction and said radio frequency amplifying means, whereby to completely form said resonant circuit having electrical characteristics corresponding to said selected one of said low band channels.

9. In the VHF television tuner circuit of claim 8, wherein said channel selection means comprises a channel selection shaft, movable contacts fixedly positioned on said channel selection shaft, and stationary contacts corresponding to said selectable channel positions and positioned in proximity to said movable contacts for coaction therewith.

10. In the VHF television tuner circuit of claim 9, wherein said first switch comprises a plurality of stationary contacts corresponding respectively to said selectable UHF/VHF converted channel position, said high band channel positions and said low band channel positions, and movable contacts positioned in proximity to said stationary contacts for coaction therewith.

11. In the VHF television tuner circuit of claim 10, wherein said induction coils are each coupled between corresponding adjacent two stationary contacts of said first switch corresponding to said high and low band channel positions, and said movable contacts are positioned in proximity to corresponding said stationary contacts for coaction therewith so as to select said corresponding at least one induction coil for connection to said second switch.

12. In the VHF television tuner circuit of claim 9, wherein said second switch comprises a first stationary contact coupled to said second receiving means, a second stationary contact coupled to said radio frequency amplifying means and to said second one of said pair of capacitors, and a third stationary contact coupled to said first one of said pair of capacitors, and said movable contacts of said second switch are positioned in proximity to said first and second stationary contacts for coaction therewith in response to selection of said UHF/VHF converted channel position, and are positioned in proximity to said second and third stationary contacts in response to selection of said high band channel positions to coact therewith for connecting said pair of capacitors in parallel fashion, and in response to selection of said low band channel positions to coact therewith for connecting said first one of said pair of capacitors in said resonance circuit and for connecting said second one of said pair of capacitors between said resonance circuit and said radio frequency amplifying means by opening said second and third stationary contacts at said low band channel positions of said channel selection shaft.

13. In the VHF television tuner circuit of claim 8, wherein said inhibiting means of said first switch comprises means for grounding said output of said first receiving means.

14. In the VHF television tuner circuit of claim 8, wherein said inhibiting means of said first switch comprises means for establishing an open circuit at said first receiving means output.

* * * * *

UNITED STATES PATENT AND TRADEMARK OFFICE
CERTIFICATE OF CORRECTION

PATENT NO. : 4,112,378

DATED : September 5, 1978

INVENTOR(S) : Katsuo Ito et al

It is certified that error appears in the above-identified patent and that said Letters Patent are hereby corrected as shown below:

*Column 3, line 35, "wouned" should be --wound--.
*Column 3, lines 50-51, "circuitting" should be --circuiting--.
*Column 6, line 14, "ivnention" should be --invention--.
 Column 6, line 48, "equivalnt" should be --equivalent--.
*Column 6, line 59, "selecion" should be --selection--.

Signed and Sealed this

First Day of May 1979

[SEAL]

Attest:

RUTH C. MASON
Attesting Officer

DONALD W. BANNER
Commissioner of Patents and Trademarks